(12) United States Patent
Dydyk et al.

(10) Patent No.: US 7,795,116 B2
(45) Date of Patent: Sep. 14, 2010

(54) WAFER CUTTING METHODS AND PACKAGES USING DICE DERIVED THEREFROM

(75) Inventors: Mark Dydyk, Cave Creek, AZ (US); Erasenthiran Poonjolai, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/286,203

(22) Filed: Sep. 29, 2008

(65) Prior Publication Data
US 2010/0078768 A1   Apr. 1, 2010

(51) Int. Cl.
*H01L 21/46*   (2006.01)
*H01L 21/78*   (2006.01)
*H01L 21/301*   (2006.01)

(52) U.S. Cl. ............... 438/460; 438/113; 438/463; 257/E21.237; 257/E21.347; 257/E21.475; 257/E21.596; 257/E21.661; 257/E21.646

(58) Field of Classification Search ......... 438/106, 438/113, 460, 462, 463, 381; 257/E21.237, 257/347, 475, 596, 646, 661
See application file for complete search history.

(56) References Cited

U.S. PATENT DOCUMENTS

| | | | | |
|---|---|---|---|---|
| 6,686,634 B2 * | 2/2004 | Ishio | ........................ | 257/394 |
| 6,960,813 B2 * | 11/2005 | Liu | ........................ | 257/414 |
| 7,112,518 B2 * | 9/2006 | Liu | ........................ | 438/487 |
| 7,169,688 B2 * | 1/2007 | Liu | ........................ | 438/463 |

* cited by examiner

*Primary Examiner*—David Nhu
(74) *Attorney, Agent, or Firm*—John N. Greaves (57) ABSTRACT

A wafer-cutting process includes first cutting a semiconductive wafer along a first path at a given first cutting intensity including cutting across an intersection. The process also includes second cutting the semiconductive wafer along a second path at a given second cutting intensity. The second cutting intensity is diminished during crossing the intersection and resumed to the given cutting intensity after crossing the intersection.

27 Claims, 7 Drawing Sheets

WAFER CUTTING METHODS AND PACKAGES USING DICE DERIVED THEREFROM

TECHNICAL FIELD

Disclosed embodiments relate to semiconductor wafers and methods of cutting them.

BACKGROUND

Figure 11:
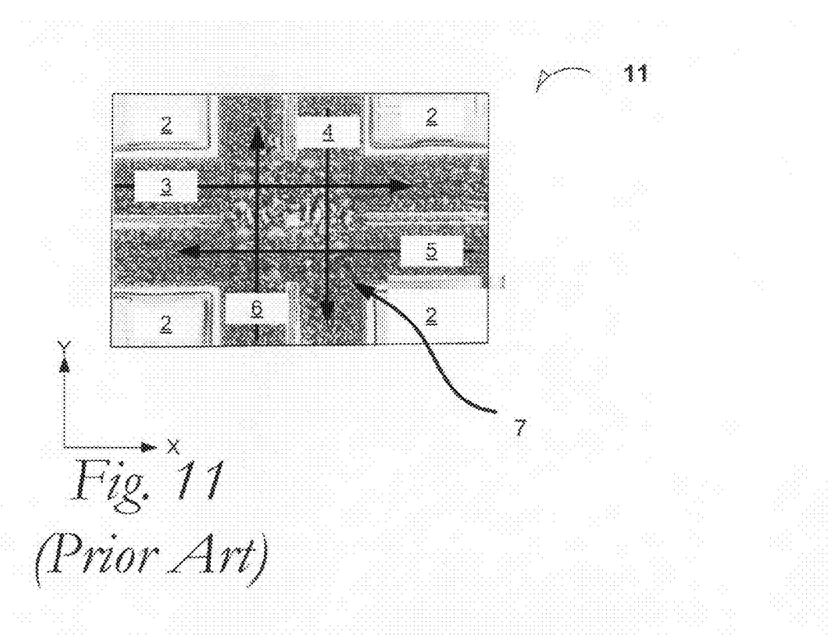
FIG. 11 is computer-image plan rendition of a photomicrograph of a wafer as a result of laser scribing according to known technique.

FIG. 11 is computer-image plan rendition of a photomicrograph of a wafer 10 as a result of laser scribing according to known technique. A top surface 2 of the wafer 10 has been altered by multiple scribing passes 3, 4, 5, and 6 that are depicted with black directional arrows to indicate translational scribing motion across the top surface 2. These multiple scribing passes have formed an intersection 7 where scribing has been concentrated as illustrated by a different surface texture at the intersection.

Figure 12:
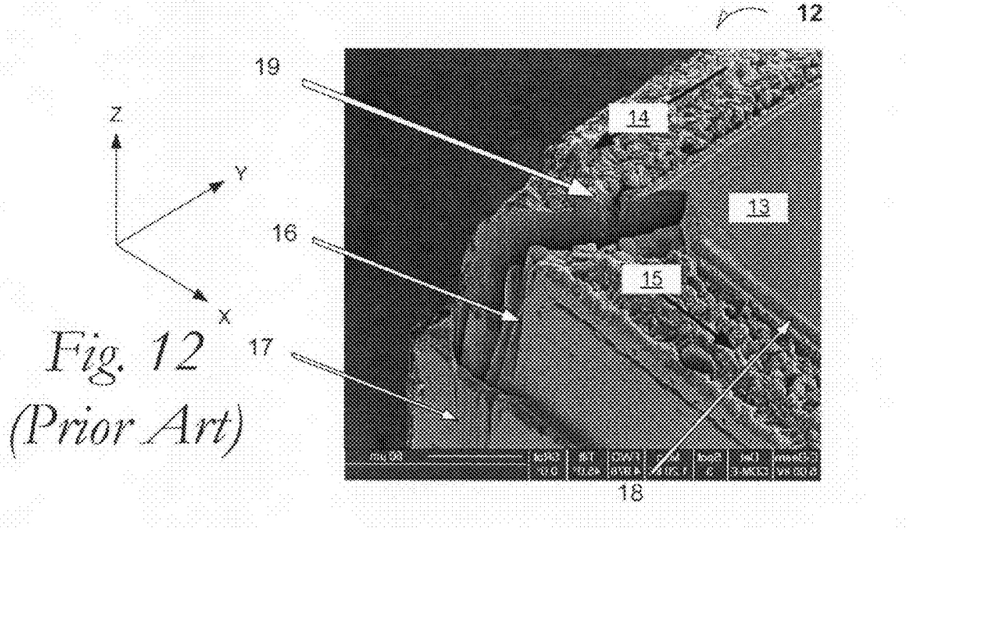
FIG. 12 is a top plan of an integrated circuit device wafer during processing according to an example embodiment.

FIG. 12 is a computer-image perspective rendition of a photomicrograph of a die 12 after laser scribing and singulating according to known technique. The die 12 includes a top surface 13 and other structures that have been altered by multiple scribing passes 14 and 15 that are depicted with black directional arrows to indicate translational scribing motion. A cleavage plane 16 is indicated with a white arrow, as well as the bulk 17 of the die therebeneath. The top surface also shows a cutting onset margin 18. Where multiple scribing passes were carried out at what was an intersection, repeated laser scribing has resulted in a deep hole 19 due to the laser repeatedly passing through the intersection.

A consequence of the deep hole 19 and other cutting irregularities that can occur at an intersection is cracks, fissures, or other weaknesses are initiated in the bulk 17 of the die 12. When the die 12 is mounted such as on an epoxy base, thermal mismatch between the die 12 and the epoxy base can make the initiated weaknesses progress to die failure.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1A:
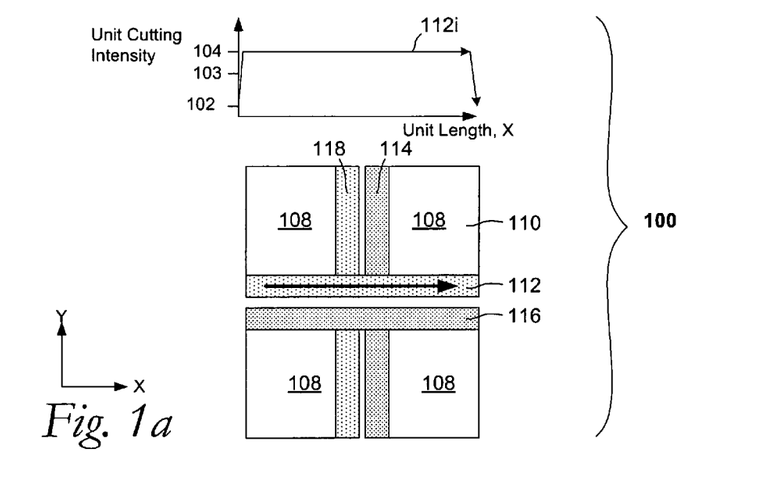
FIG. 1a is a top plan and a cutting intensity graph of an integrated circuit device wafer during processing according to an example embodiment.

FIG. 1a is a top plan and a cutting intensity graph 100 of an integrated circuit device wafer during processing according to an example embodiment. The integrated circuit device wafer 110 is depicted with four cutting processes having been carried out. A top surface 108 is also depicted. Processing includes a first cutting path 112 and a second cutting path 114. The cutting intensity 112i is illustrated in the graph from the first cutting path 112 where the graph and the wafer are vertically aligned. In an embodiment, a radiant-energy ablating action may include plasma ion-beam cutting. In an embodiment, a radiant-energy ablating action may include laser cutting, which may also be referred to as lasing. A zero intensity begins at 102, followed by a wafer-fusion-onset intensity at 103. This means the wafer begins to melt and lose structural integrity. At an intensity above the wafer-fusion-onset intensity 103, a maximum intensity is depicted at 104. In an embodiment, cutting intensity is greater than the wafer-fusion-onset intensity 103 in order to accommodate heat dissipation. Further, sufficient maximum intensity 104 allows cutting action to melt, smoothen, and recast the semiconductive wafer 110 and to leave the first cutting path 112. Further cutting is depicted as a first subsequent cutting path 116 and a second subsequent cutting path 118.

In an embodiment, the first cutting intensity 103 includes unitary excess energy to melt, smoothen, and recast the semiconductive wafer 110. Second cutting intensity includes more than half the unitary excess energy to melt, smoothen, and recast the semiconductive wafer. As a consequence, the cumulative effect at the intersection does not initiate faults or other imperfections compared to a non-intersection cutting location.

Figure 1B:
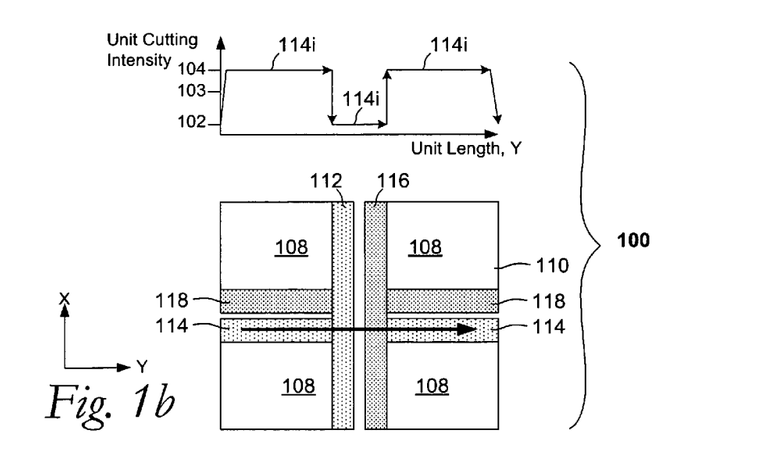
FIG. 1b is a top plan and a cutting intensity graph of the integrated circuit device wafer depicted in FIG. 1a after further processing according to an embodiment.

FIG. 1b is a top plan and a cutting intensity graph of the integrated circuit device wafer 100 depicted in FIG. 1a after further processing according to an embodiment. FIG. 1b is rotated 90 degrees from the orientation of FIG. 1a. The cutting intensity 114i is illustrated from the second cutting path 114 along the directional arrow. Zero intensity begins at 102, followed by a wafer-fusion-onset intensity at 103. Second cutting as illustrated by the cutting intensity 114i graph is illustrated as diminished to zero intensity 102 during crossing the intersection that has been formed by the first cutting 112 depicted in FIG. 1a. The cutting intensity graph 114i shows resuming to the given previous cutting 104 intensity after crossing the intersection. Consequently, wafer material that has been cut within the intersection can be substantially uniform in result by diminishing cutting intensity; in this illustration to zero intensity 102.

In this embodiment, the effect of first cutting is to form a first scribe street as illustrated by the first cutting path 112 and the first subsequent cutting path 116. Similarly, the effect of second cutting is to form a second scribe street; in this embodiment as illustrated by the second cutting path 114 and the second subsequent cutting path 118. The characteristic of the second scribe street is that cutting intensity is diminished as cutting action crosses what will become the first scribe street. Consequent to the wafer-cutting embodiments, distinct cutting irregularities are avoided such that scribe-street intersections are characterized by uniform cutting scars that are not distinguishable from cutting scars at non-intersection portions of the wafer.

Figure 2:
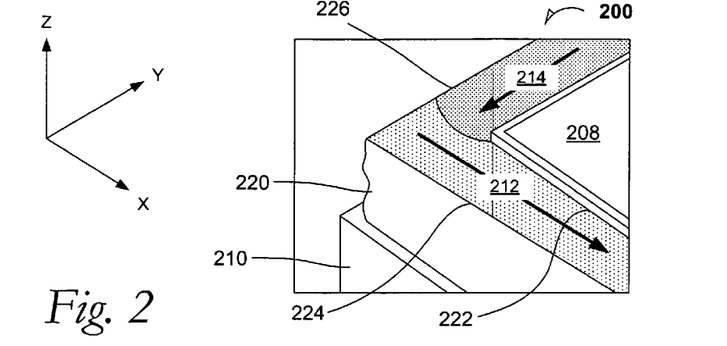
FIG. 2 is a perspective elevation of a die that has been singulated after cutting according to a process embodiment.

FIG. 2 is a perspective elevation of a die that has been singulated after cutting according to a process embodiment. The die 200 includes a top surface 208 and other structures that have been altered by first- and second-cutting passes 214 and 216, respectively, that are depicted with black directional arrows and with differing shading to indicate different translational scribing motions. A cleavage plane 220 is indicated, as well as the bulk 210 of the die 200 therebeneath. A cutting onset margin 222 is also depicted that represents a boundary between unaffected wafer material and cut wafer material. The first cutting pass 214 has left a first edge 224 and the second cutting pass 216 has left a second edge 226. The first edge 224 and the second edge 226 lie in a plane that is coplanar with the tip surface 208. Consequently because of the process embodiments, the first cutting pass 214 and the second cutting pass 216 have left uniformly planar surfaces that coplanar to the top surface 208.

During the second cutting 214, cutting intensity is diminished during crossing the intersection that has been previously established by the first cutting 212. When the die 200 is mounted such as on an epoxy base, thermal mismatch between the die 200 and the epoxy is not made worse because the formation of initiated weaknesses has been avoided.

In this embodiment, the effect of first cutting is to form a first scribe street as illustrated in part by the first cutting path 212. Similarly, the effect of second cutting is to form a second scribe street as illustrated in part in this embodiment by the second cutting path 214. The characteristic of the second scribe street is that cutting intensity is diminished as cutting action crosses what will become the first scribe street.

Figure 3:
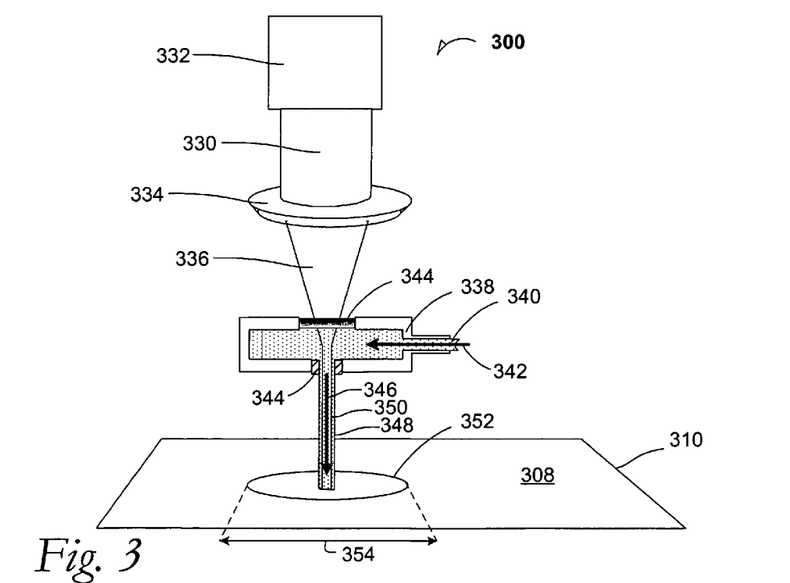
FIG. 3 is a side elevation of a wafer cutting process according to an embodiment.

FIG. 3 is a side elevation of a wafer cutting process 300 according to an embodiment. A wafer 310 is illustrated with a top surface 308 and a laser beam 330 is depicted emitting from a laser generator 332. The laser beam 330 is depicted passing through a lens 334 to form a focusing laser beam 336. In an embodiment, a fluid jacket 338 allows a fluid 340 such as water to pass into the fluid jacket 338 in a first direction 342. Other fluids may be used such as inorganic liquids that are unreactive to the wafer 310 during energetic cutting.

The focusing laser beam 336 passes through a jacket window 344 and out of the fluid jacket 338 through a fluid nozzle 346 in a second direction 348. A fluid jet 350 acts as a fluid waveguide for the emitting laser beam 352.

In an embodiment, cutting the wafer 310 is done by using the fluid jet as a waveguide. The fluid jet 350 functions as a variable-length waveguide for directing the emitting laser beam 352 onto the wafer 310 during cutting. The fluid jet 350 may be used to eject molten wafer material according to an embodiment. The fluid jet 350 may also be used to cool the wafer 310 during cutting. In an embodiment, the fluid jet 350 may be used to prevent re-deposition of molten wafer material that can result in a smoother cutting margin as well as a cutting margin that is more parallel-planar to the top surface 308.

In an embodiment, cutting the wafer 310 with the emitting laser beam 352 leaves an affected area 354 that is effectively up to the cutting onset margin (see e.g., item 222 in FIG. 2). Consequently, the affected area 354 has a characteristic diameter 356 of affected and changed wafer material.

In an embodiment, cutting with a laser may be done with a pulsed excimer laser. Cutting with a laser may also be done with a solid-state laser that emits at wavelengths of between 193 nanometers (nm) to 1064 nm at a laser pulse repetition rate between 1 to about 80000 kilo-Hertz (kHz). It is to be understood that the wavelength and laser repetition rate to be utilized may be varied depending on requirements. For example, a smaller or shorter laser wavelength may be used to achieve a selected smaller ablation depth. A longer laser wavelength may be used to enhance surface melt onset and re-solidification.

In an embodiment, the emitting laser beam 352 may be used with or without the fluid waveguide. The emitting laser beam 352 may have a impinging beam width of about 32 micrometer ($\mu$m).

Figure 4:
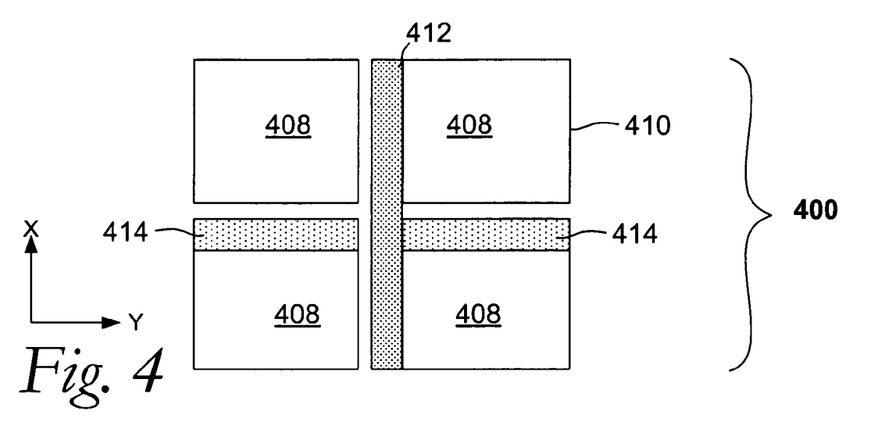
FIG. 4 is a top plan of an integrated circuit device wafer during processing according to an example embodiment.

FIG. 4 is a top plan 400 of an integrated circuit device wafer 410 during processing according to an example embodiment. The integrated circuit device wafer 410 is depicted with two cutting processes having been carried out. A top surface 408 is also depicted. Processing has resulted in a first cutting path 412 and a second cutting path 414. After first- and second cutting 412 and 414, respectively, the wafer is singulated into several dice. In any event, second cutting is diminished from a given intensity as cutting action crosses the intersection, and is resumed to the given intensity after crossing the intersection.

In this embodiment, the effect of first cutting is to form a first scribe street as illustrated by the first cutting path 412. Similarly, the effect of second cutting is to form a second scribe street; in this embodiment as illustrated by the second cutting path 414. The characteristic of the second scribe street is that cutting intensity is diminished as cutting action crosses what will become the first scribe street.

Figure 5:
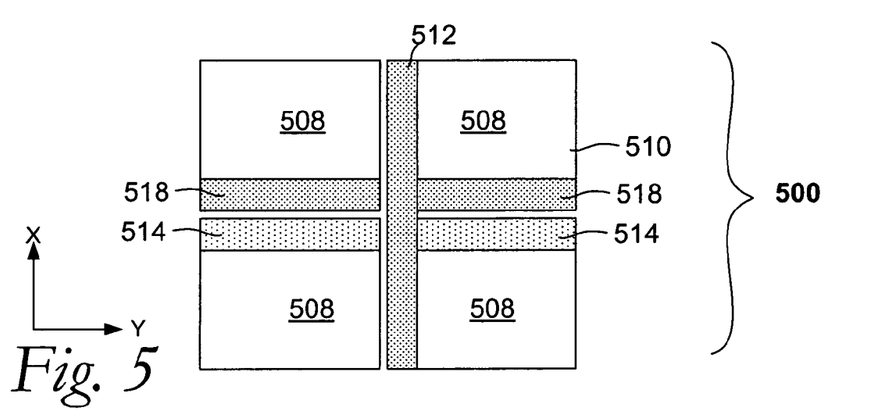
FIG. 5 is a top plan of an integrated circuit device wafer during processing according to an example embodiment.

FIG. 5 is a top plan 500 of an integrated circuit device wafer 510 during processing according to an example embodiment. The integrated circuit device wafer 510 is depicted with three cutting processes having been carried out. A top surface 508 is also depicted. Processing has resulted in a first cutting path 512 and a second cutting path 514. A second subsequent cutting path 518 is also depicted. After first, second, and second subsequent cutting 512, 514, and 518, respectively, the wafer is singulated into several dice. In any event, second cutting and second subsequent cutting are diminished from a given intensity as cutting action crosses the intersection, and is resumed to the given intensity after crossing the intersection.

In this embodiment, the effect of first cutting is to form a first scribe street as illustrated by the first cutting path 512. Similarly, the effect of second cutting is to form a second scribe street; in this embodiment as illustrated by the second cutting path 514 and the second subsequent cutting path 518. The characteristic of the second scribe street is that cutting intensity is diminished as cutting action crosses what will become the first scribe street.

Figure 6:
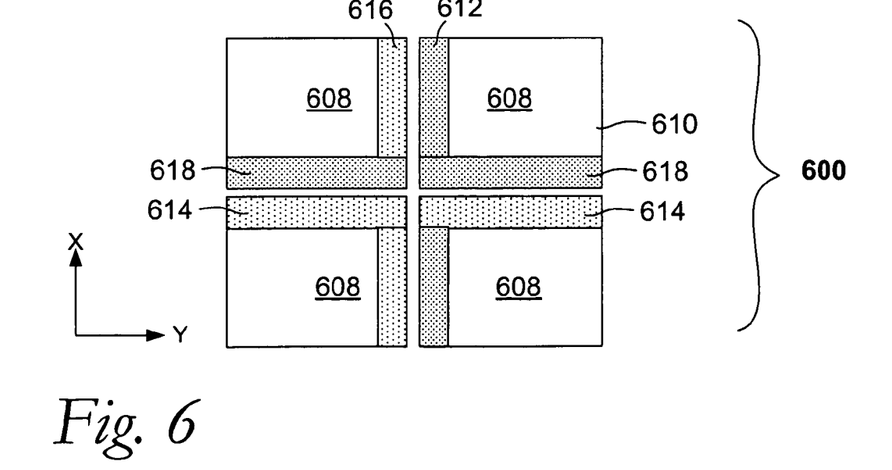
FIG. 6 is a top plan of an integrated circuit device wafer during processing according to an example embodiment.

FIG. 6 is a top plan 600 of an integrated circuit device wafer 610 during processing according to an example embodiment. The integrated circuit device wafer 610 is depicted with four cutting processes having been carried out. A top surface 608 is also depicted. Processing has resulted in a first cutting path 612 and a second cutting path 614. A first subsequent cutting path 616 and a second subsequent cutting path 618 are also depicted. After first, first subsequent, second, and second subsequent cutting paths 612, 616, 614, and 618, respectively, the wafer is singulated into several dice. In this embodiment each cutting path is formed where cutting intensity is diminished from a given intensity as cutting action crosses the intersection, and is resumed to the given intensity after crossing the intersection.

In this embodiment, the effect of first cutting is to form a first scribe street as illustrated by the first cutting path 612 and the first subsequent cutting path 616. Similarly, the effect of second cutting is to form a second scribe street; in this embodiment as illustrated by the second cutting path 614 and the second subsequent cutting path 618. The characteristic of both the first scribe street and the second scribe street is that cutting intensity is diminished as cutting action crosses what will become the first- and second scribe streets.

Figure 7:
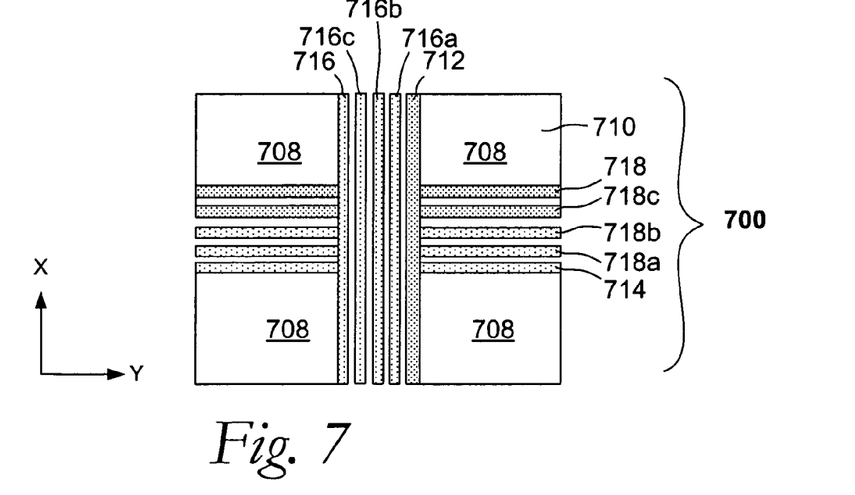
FIG. 7 is a top plan of an integrated circuit device wafer during processing according to an example embodiment.

FIG. 7 is a top plan of an integrated circuit device wafer 710 during processing according to an example embodiment. The integrated circuit device wafer 710 is depicted with up to ten cutting processes having been carried out. A top surface 708 is also depicted. Processing has resulted in a first cutting path 712 and a second cutting path 714 that is diminished in cutting intensity as it crosses the intersection made by the several first cutting paths. A first subsequent cutting path 716 is also depicted as well as a second subsequent cutting path 718 that is also diminished in cutting intensity as it crosses the intersection made by the several first cutting paths.

The first cutting paths may result in a first scribe street that includes the first cutting path 712 and the first subsequent cutting path 716 as well as up to three more first cutting paths 716a, 716b, and 716c. The second cutting paths may result in a second scribe street that includes the second cutting path 714 and the second subsequent cutting path 718 as well as up to three more second cutting paths 718a, 718b, and 718c, each of which are diminished in cutting intensity as they cross the intersection made by the several first cutting paths. In any event, all second cutting actions are diminished from a given intensity as cutting action crosses the intersection, and are resumed to the given intensity after crossing the intersection. It may now be understood that similarly to the method depicted in FIG. 6, the method depicted in FIG. 7 may also include both achieved scribe streets being formed by diminishing cutting intensity during crossing what will become a scribe street intersection. Further, any combination of maintaining cutting intensity may be coupled with at least one action of diminishing cutting intensity while crossing the intersection.

After all cutting actions are accomplished the wafer 700 is singulated into several dice.

In this embodiment, the effect of first cutting is to form a first scribe street as illustrated by the first cutting path 712, the first subsequent cutting path 716, and other first cutting paths 716a, 716b, and 716c. Similarly, the effect of second cutting is to form a second scribe street; in this embodiment as illustrated by the second cutting path 714, the second subsequent cutting path 718, and other second cutting paths 718a, 718b, and 718c. The characteristic of the second scribe street is that cutting intensity is diminished as cutting action crosses what will become the first scribe street.

Figure 8:
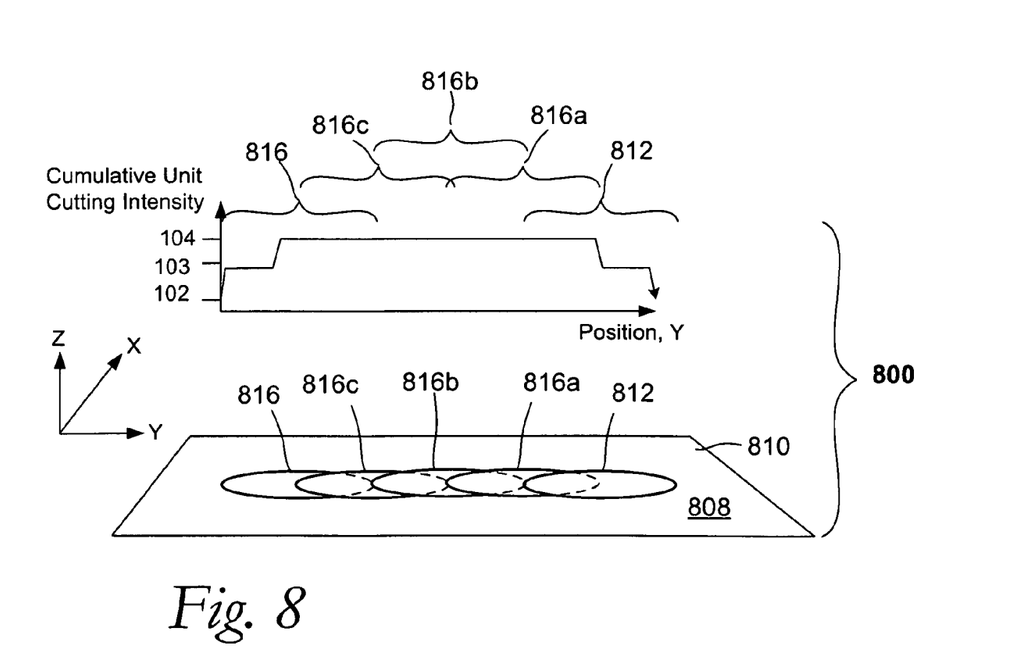
FIG. 8 is a perspective view and a cutting intensity graph of an integrated circuit device wafer during processing according to an example embodiment.

FIG. 8 is a perspective view and a cutting intensity graph 800 of an integrated circuit device wafer 810 during processing according to an example embodiment. The integrated circuit device wafer 810 is depicted with the effect of five cutting processes having been carried out, and with a focus of a single X-coordinate along the Y-axis along the top surface 808. Processing includes a snapshot of the cutting "footprints" along a second cutting path 814 and a second subsequent cutting path 818. Additionally, other footprints along several other second cutting paths 818a, 818b, and 818c are depicted. The graph depicts cumulative unit cutting intensity due to overlapping cutting effect of the several cutting path footprints. The first cutting path footprint 812 is bracketed to show a step in cumulative cutting intensity as it overlaps with the cutting path 816a footprint. Similarly, the first subsequent cutting path 816 footprint is bracketed to show a step in cumulative cutting intensity as it overlaps with the cutting path 816c footprint.

It can now be appreciated that the up to five first cutting paths depicted in FIGS. 4, 5, 6, and 7 may also be achieved by overlapping cutting effect and cutting intensity. Similarly, it can now be appreciated that the up to five second cutting paths depicted in FIGS. 4, 5, 6, and 7 may also be achieved by overlapping cutting effect and cutting intensity, but in any event all second cutting actions are diminished from a given intensity as cutting action crosses the intersection, and are resumed to the given intensity after crossing the intersection.

It can also now be appreciated that the up to five second cutting paths depicted in FIGS. 4, 5, 6, and 7 may also be achieved by overlapping cutting effect and cutting intensity, but in any event at least one of the first-type or second-type cutting actions can be diminished from a given intensity as cutting action crosses the intersection, and is resumed to the given intensity after crossing the intersection.

Figure 9:
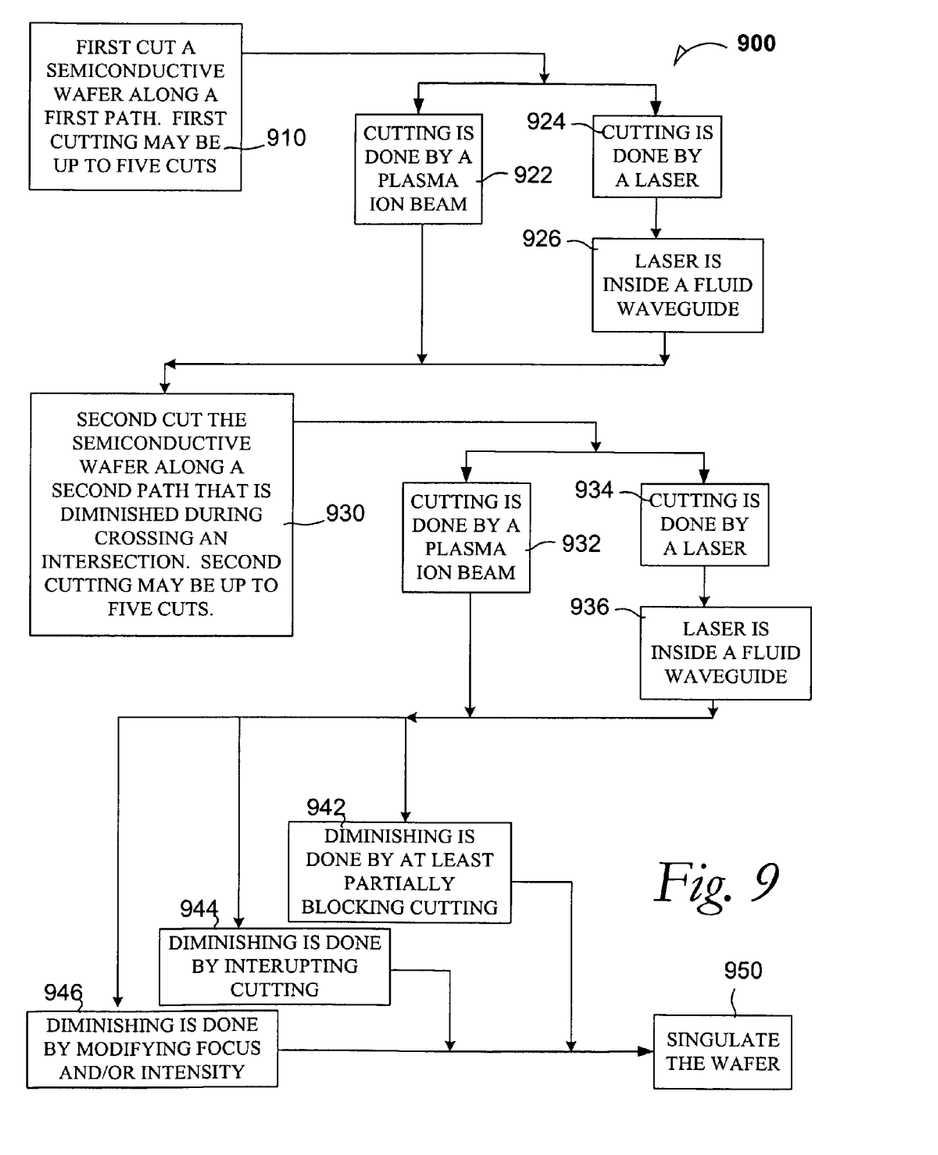
FIG. 9 is a process flow diagram according to an embodiment.

FIG. 9 is a process flow diagram 900 according to an embodiment.

At 910, the process includes first cutting a semiconductive wafer along a first path. The first cutting process may include up to five cuts.

At 922, first cutting is done by a plasma ion beam.

At 924, first cutting is alternatively done by a laser.

At 926, laser first cutting is done inside a fluid waveguide. Other conventional and known cutting techniques may be used with the disclosed wafer-cutting embodiments.

At 930, the process includes second cutting the semiconductive wafer along a second path. The second cutting is diminished while crossing an intersection that is formed with the first cutting path(s). The second cutting process may include up to five cuts. In an embodiment, first and second cutting may also include the act of singulating such that after first and second cutting are accomplished, a singulated die is produced from a wafer.

At 932, second cutting is done by a plasma ion beam.

At 934, second cutting is alternatively done by a laser.

At 936, laser second cutting is done inside a fluid waveguide. Other conventional and known cutting techniques may be used with the disclosed wafer-cutting embodiments.

At 942, diminishing second cutting is done by at least partially blocking cutting. In a non-limiting embodiment, at least partially blocking includes applying a filter to a laser beam. In a non-limiting embodiment, at least partially blocking includes deflecting a laser beam. In a non-limiting embodiment, at least partially blocking includes dumping a laser beam into an absorber.

At 944, diminishing is done by interrupting cutting. In a non-limiting embodiment, a laser is turned off while crossing the intersection. In an embodiment, lasing is done by Q-switching a laser between ON and OFF to diminish cutting.

At 946, diminishing is done by modifying focus and/or intensity. Reference is again made to FIGS. 1a and 1b. Where the unit cutting intensity in FIG. 1b shows a drop to zero intensity 102 while crossing the intersection, diminishing may be modified such that the first cutting intensity 112i may be nonzero at 103 or higher. Similarly, the second cutting intensity 114i may also be nonzero at 103 or higher such that the cumulative effect of first cutting and second cutting upon the integrated circuit wafer is the same as upon a non-intersection first- or second path segment.

Diminishing by modifying may be done by altering focus such as merely raising the Z-height of the beam source 332; in this embodiment, a laser generator 332.

Where the cutting is a radiant-energy ablating system such as a laser beam, the laser cutting system may be equipped with galvanometer steering mirrors and lenses for focusing the laser beams on a work piece surface. The laser cutting system may be equipped or coupled to a computing device to receive process and/or execute the template defining the pattern of induced defects. It is also to be understood that other laser cutting systems may be used with suitable modifications.

Figure 10:
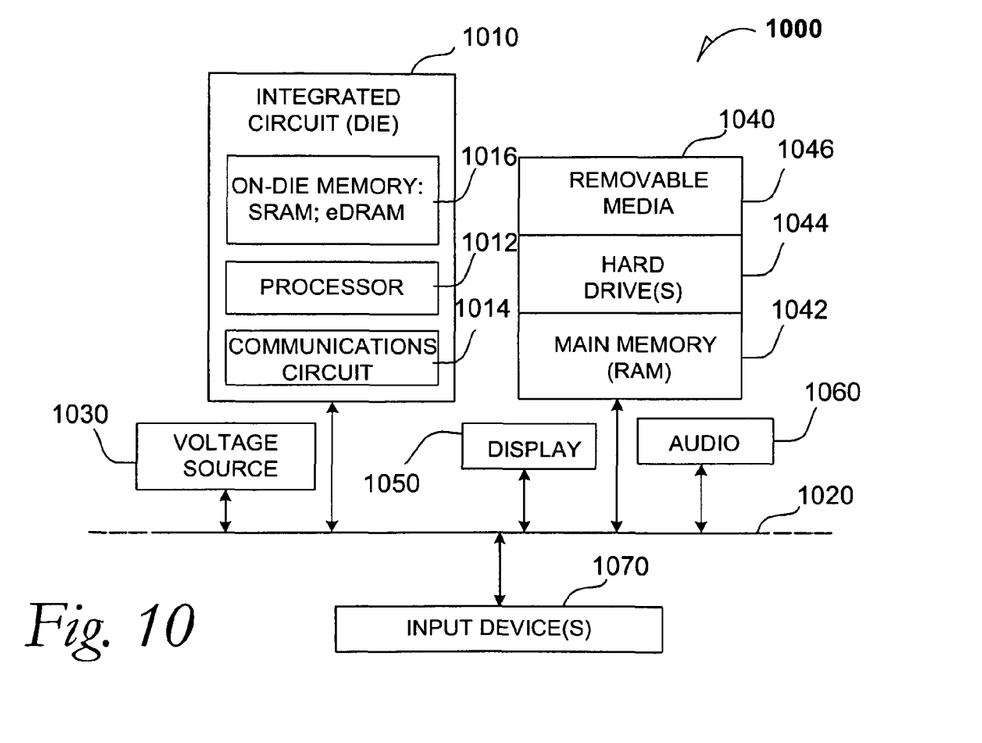
FIG. 10 is a schematic of an electronic system according to an embodiment.

FIG. 10 is a schematic of an electronic system according to an embodiment. The electronic system 1000 as depicted can embody a die that has been cut from a wafer according to any of the several disclosed embodiments and their equivalents as set forth in this disclosure. In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. Other types of circuits that can be included in the integrated circuit 1010 are a custom circuit or an application-specific integrated circuit (ASIC), such as a communications circuit 1014 for use in wireless devices such as cellular telephones, pagers, portable computers, two-way radios, and similar electronic systems. In an embodiment, the processor 1010 includes on-die memory 1016 such as static random-access memory (SRAM). In an embodiment, the processor 1010 includes embedded on-die memory 1016 such as embedded dynamic random-access memory (eDRAM).

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory keys, and other removable media known in the art.

In an embodiment, the electronic system 1000 also includes a display device 1050, an audio output 1060. In an embodiment, the electronic system 1000 includes a controller 1070, such as a keyboard, mouse, trackball, game controller, microphone, voice-recognition device, or any other device that inputs information into the electronic system 1000.

As shown herein, the integrated circuit 1010 can be implemented in a number of different embodiments, including a die that has been cut from a wafer according to any of the several disclosed embodiments and their equivalents, an electronic system, a computer system, one or more methods of fabricating an integrated circuit, and one or more methods of fabricating an electronic assembly that includes a die that has been cut from a wafer according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration, such as single-edge, double-edge, triple-edge, and all four edges being occupied by dice that have been cut from wafers according to any of the several disclosed embodiments and their equivalents.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of cutting a semiconductive wafer comprising:
    first cutting a semiconductive wafer along a first path at a given first cutting intensity including cutting across an intersection; and
    second cutting the semiconductive wafer along a second path at a second given cutting intensity, wherein the second cutting intensity is diminished during crossing the intersection and resumed to the second given cutting intensity after crossing the intersection.

2. The method of claim 1, wherein first cutting includes forming a first scribe street, and wherein second cutting includes forming a second scribe street.

3. The method of claim 1, wherein second cutting includes singulating a portion of the wafer.

4. The method of claim 1, wherein cutting includes radiant-energy ablating the semiconductive wafer.

5. The method of claim 1, wherein cutting includes radiant-energy ablating the semiconductive wafer by use of a plasma ion beam.

6. The method of claim 1, wherein cutting includes lasing the semiconductive wafer.

7. The method of claim 1, wherein cutting includes lasing the semiconductive wafer, and wherein lasing includes emitting a laser beam through a fluid waveguide.

8. The method of claim 1, wherein cutting includes lasing the semiconductive wafer, and wherein lasing includes emitting a laser beam through a fluid waveguide, and wherein the fluid waveguide includes water.

9. The method of claim 1, wherein second cutting is diminished by at least partially blocking second cutting.

10. The method of claim 1, wherein second cutting is diminished by interrupting second cutting.

11. The method of claim 1, wherein second cutting is diminished by modifying radiant-energy ablating.

12. The method of claim 1, further including first subsequent cutting the semiconductive wafer along a first subsequent path that is parallel to the first path to form a first scribe street.

13. The method of claim 1, further including first subsequent cutting the semiconductive wafer along a first subsequent path that is parallel to the first path, and wherein first subsequent cutting includes an at least partially overlapping first cutting.

14. The method of claim 1, further including first subsequent cutting the semiconductive wafer along a first subsequent that is parallel to the first path, and wherein first subsequent cutting is preceded by at least one of three subsequent cutting actions parallel to the first path.

15. The method of claim 1, further including second subsequent cutting the semiconductive wafer along a second subsequent path that is parallel to the second path to form a second scribe street, wherein the second subsequent cutting is diminished during crossing the intersection.

16. The method of claim 1, further including second subsequent cutting the semiconductive wafer along a second subsequent path that is parallel to the second path, and wherein second subsequent cutting includes an at least partially overlapping second cutting.

17. The method of claim 1, further including second subsequent cutting the semiconductive wafer along a second subsequent that is parallel to the second path, and wherein second subsequent cutting is preceded by at least one of three subsequent cutting actions parallel to the second path.

18. The method of claim 1, further including:
first subsequent cutting the semiconductive wafer along a first subsequent path that is parallel to the first path to form a first scribe street;
second subsequent cutting the semiconductive wafer along a second subsequent path that is parallel to the second path to form a second scribe street, wherein the second subsequent cutting is diminished during crossing the intersection; and
wherein by first cutting, first subsequent cutting, second cutting, and second subsequent cutting, the intersection is defined in the semiconductive wafer.

19. The method of claim 1, wherein diminishing second cutting includes Q-switch ON and OFF switching during lasing to achieve diminishing second cutting.

20. The method of claim 1, wherein first cutting intensity includes unitary excess energy to melt, smoothen, and recast the semiconductive wafer, and wherein second cutting intensity includes more than half the unitary excess energy to melt, smoothen, and recast the semiconductive wafer.

21. The method of claim 1, wherein diminishing cutting is achieved by altering focal intensity of radiant-energy ablating under conditions to smoothen and recast the semiconductive wafer.

22. A method of cutting a semiconductive wafer comprising:
first cutting a semiconductive wafer along a first path at a given first cutting intensity including cutting across an intersection, wherein the first cutting intensity is diminished during crossing the intersection and resumed to the first given cutting intensity after crossing the intersection; and
second cutting the semiconductive wafer along a second path at a second given cutting intensity, wherein the second cutting intensity is diminished during crossing the intersection and resumed to the second given cutting intensity after crossing the intersection.

23. The method of claim 22, wherein first cutting includes forming a first scribe street, and wherein second cutting includes forming a second scribe street.

24. The method of claim 22, wherein second cutting includes singulating a portion of the wafer.

25. A method of cutting a semiconductive wafer comprising:
first cutting a semiconductive wafer along a first path at a given first cutting intensity including cutting across an intersection;
second cutting the semiconductive wafer along a second path at a second given cutting intensity, wherein the second cutting intensity is diminished during crossing the intersection and resumed to the second given cutting intensity after crossing the intersection, wherein cutting includes lasing the semiconductive wafer, and wherein lasing includes emitting a laser beam through a fluid waveguide;
first subsequent cutting the semiconductive wafer along a first subsequent that is parallel to the first path, and wherein first subsequent cutting is preceded by at least one of three subsequent cutting actions parallel to the first path; and
second subsequent cutting the semiconductive wafer along a second subsequent path that is parallel to the second path to form a second scribe street, wherein the second subsequent cutting is diminished during crossing the intersection.

26. The method of claim 25, wherein first cutting intensity includes unitary excess energy to melt, smoothen, and recast the semiconductive wafer, wherein second cutting intensity includes more than half the unitary excess energy to melt, smoothen, and recast the semiconductive wafer, and wherein diminishing cutting is achieved by altering focal intensity of radiant-energy ablating under conditions to smoothen and recast the semiconductive wafer.

27. The method of claim 25, wherein diminishing second cutting includes Q-switch ON and OFF switching during lasing to achieve diminishing second cutting.

* * * * *